US012684876B2

(12) United States Patent
Zhou et al.

(10) Patent No.: US 12,684,876 B2
(45) Date of Patent: Jul. 14, 2026

(54) PROTECTION DIODE MATRIX FOR ANTENNA PROTECTION

(71) Applicant: International Business Machines Corporation, Armonk, NY (US)

(72) Inventors: Huimei Zhou, Albany, NY (US); Terence B. Hook, Jericho, VT (US); Yoo-Mi Lee, Montvale, NJ (US); Feng Liu, Niskayuna, NY (US); Chen Zhang, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 436 days.

(21) Appl. No.: 18/469,868

(22) Filed: Sep. 19, 2023

(65) Prior Publication Data

US 2025/0098329 A1     Mar. 20, 2025

(51) Int. Cl.
*H10D 89/60*          (2025.01)
*H10D 86/01*          (2025.01)

(52) U.S. Cl.
CPC ....... *H10D 89/611* (2025.01); *H10D 86/0214* (2025.01)

(58) Field of Classification Search
CPC .... H10D 30/019; H10D 84/851; H10D 88/00; H10D 30/6735; H10D 89/611; H10D 84/0158; H10D 84/0193; H10D 86/011; H10D 84/834; H10D 84/853; H10D 86/215; H10D 30/501–509; H10D 84/0165–0195; H10B 12/36; H10B 12/056
See application file for complete search history.

(56) References Cited

U.S. PATENT DOCUMENTS

| | | |
|---|---|---|
| 8,354,722 B2 | 1/2013 | Campi, Jr. |
| 8,686,510 B2 | 4/2014 | Gossner |
| 9,679,888 B1 | 6/2017 | Lee |
| 10,854,596 B2 | 12/2020 | Gorbachov |

(Continued)

OTHER PUBLICATIONS

Di, M. et al, "Electrostatic Discharge Switch Simulation Enablement in RF SOI Technologies," 2021 IEEE International Symposium on the Physical and Failure Analysis of Integrated Circuits (IPFA), Singapore, Singapore, 2021, pp. 1-5, doi: 10.1109/IPFA53173.2021.9617309.

(Continued)

*Primary Examiner* — Wasiul Haider

(74) *Attorney, Agent, or Firm* — L. Jeffrey Kelly

(57) ABSTRACT

Embodiments are disclosed for a semiconductor structure. The semiconductor structure includes a first nanosheet layer. The first nanosheet layer includes a first channel region, and a heavily doped epitaxial region of a first type. Further, the semiconductor structure includes a second nanosheet layer. The second nanosheet layer includes a second channel region, a heavily doped epitaxial region of a second type disposed above the first nanosheet layer, and a first gate surrounding the first channel region and the second channel region. Additionally, the semiconductor structure includes a protection diode. The protection diode includes a source, a drain, and a second gate. The drain is connected to the first gate, and the second gate is connected to the source.

9 Claims, 6 Drawing Sheets

(56)                    References Cited

U.S. PATENT DOCUMENTS

| | | | |
|---|---|---|---|
| 2023/0064525 A1 | 3/2023 | Hsu | |
| 2023/0089395 A1* | 3/2023 | Orr ........................ | H10D 88/00 |
| | | | 257/369 |
| 2023/0092315 A1 | 3/2023 | Kai | |
| 2023/0110825 A1 | 4/2023 | Huimei | |
| 2025/0140639 A1* | 5/2025 | Shih ................... | H10W 40/254 |

OTHER PUBLICATIONS

Fonteneau, P. et al, "Innovative high-density ESD protection device in state of the art UTBB FDSOI technologies," 2015 37th Electrical Overstress/Electrostatic Discharge Symposium (EOS/ESD), Reno, NV, USA, 2015, pp. 1-7, doi: 10.1109/EOSESD.2015.7314808.
Wang, X.S. et al., "Concurrent Design Analysis of High-Linearity SP10T Switch With 8.5 kV ESD Protection," in IEEE Journal of Solid-State Circuits, vol. 49, No. 9, pp. 1927-1941, Sep. 2014, doi: 10.1109/JSSC.2014.2331956.

\* cited by examiner

PROTECTION DIODE MATRIX FOR ANTENNA PROTECTION

BACKGROUND

The present invention generally relates to protection diodes, and more particularly to a protection diode matrix for antenna protection in stacked field effect transistor (FET) or a backside power distribution network (BSPDN).

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chip-makers face a myriad of challenges at 5 nm, 3 nm and beyond. Currently, traditional chip scaling continues to slow as process complexities and costs escalate at each node.

A potential solution to this chip scaling problem is gate all around technology. One example of a complex gate all around technology is a complementary FET (CFET) where n-type FET (nFET) and p-type FET (pFET) nanowires/nanosheets are vertically stacked on top of each other. Furthermore, additional improvement in density may be achieved by removing the substrate and replacing it with insulators and wires, such that there are wiring levels both above and below the active transistor layers.

SUMMARY

Embodiments are disclosed for a semiconductor structure. The semiconductor structure includes a first nanosheet layer. The first nanosheet layer includes a first channel region, and a heavily doped epitaxial region of a first type. Further, the semiconductor structure includes a second nanosheet layer. The second nanosheet layer includes a second channel region, a heavily doped epitaxial region of a second type disposed above the first nanosheet layer, and a first gate surrounding the first channel region and the second channel region. Additionally, the semiconductor structure includes a protection diode. The protection diode includes a source, a drain, and a second gate. The drain is connected to the first gate, and the second gate is connected to the source.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
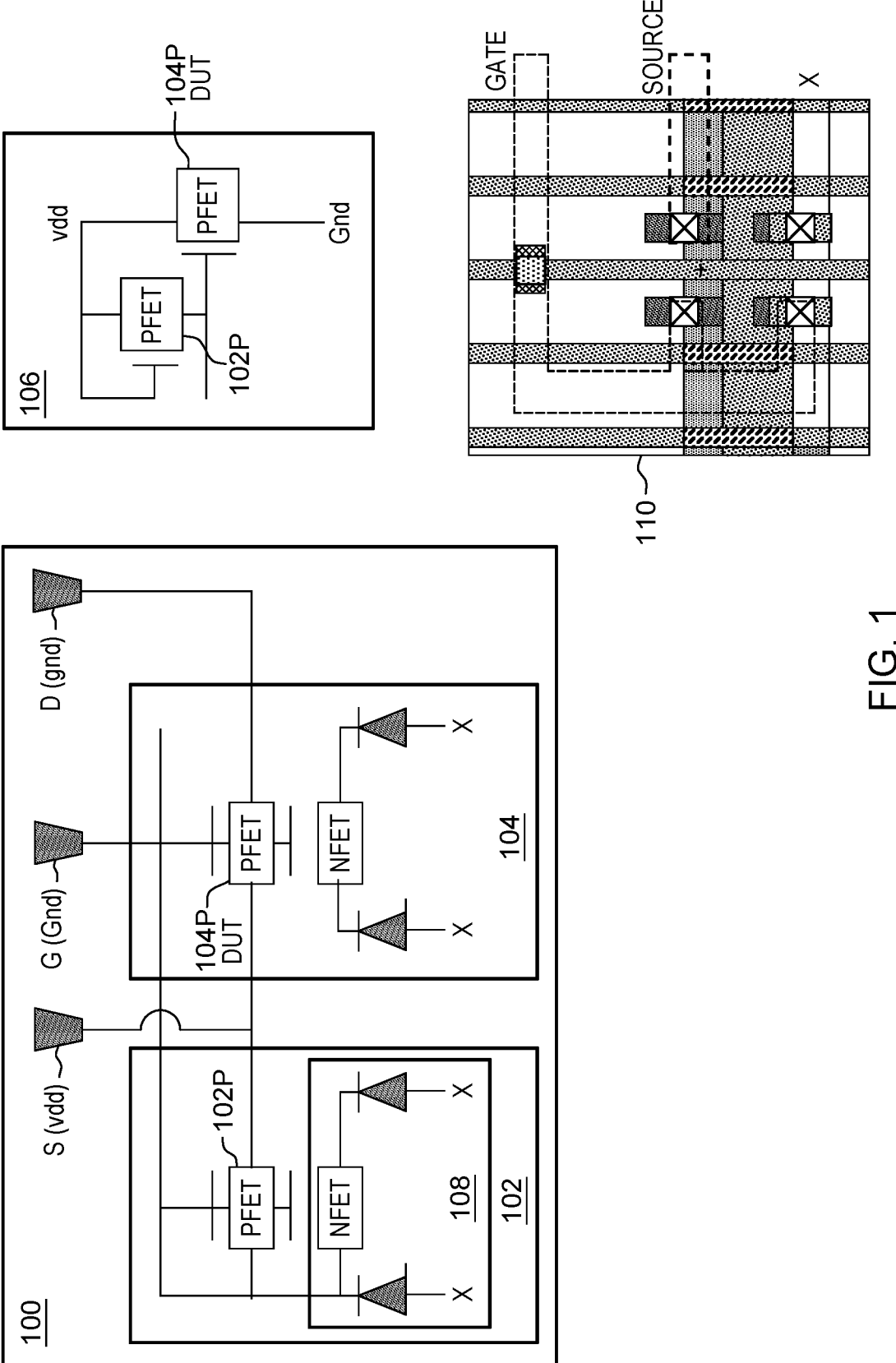
FIG. 1 is a schematic of an example protection diode and stacked field effect transistor (FET), in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the example embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub lithographic" may refer to a dimension or size less than current dimensions achievable by photolithographic processes, and the term "lithographic" may refer to a dimension or size equal to or greater than current dimensions achievable by photolithographic processes. The sub lithographic and lithographic dimensions may be determined by a person of ordinary skill in the art at the time the application is filed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As stated previously, in complementary FET designs, nFET and pFET nanowires and/or layers of nanosheets are vertically stacked on top of each other. The nFET nanowires and/or layer include However, it can be challenging to form protection diodes to protect the pFET from charging damage during processing because of the unique design and architecture of stacked FETs, wherein the pFET is normally isolated from the substrate. A diode is a semiconductor device that allows current to flow more easily in one direction than the opposite direction. Further, the diode restricts current from flowing in the opposite direction. As such, a protection diode can be a diode that mitigates plasma induced damage (PID), or the effects of electrostatic discharge (ESD), by directing current away from the FETs that the diode is protecting while minimally perturbing normal operations.

For protection diodes in bulk technology, junctions may be useful. For example, the available junction in a stacked FET arrangement is limited to a n-p junction (i.e., a junction between a n-type FET (nFET) and the p-type substrate). Further, when the stacked FET is operating as an nFET, the n-p junction operates with reverse bias. However, when the stacked FET is operating as a pFET, the n-p junction would be forward biased, meaning the pFET would have spurious high leakage on the gate node to be protected. As such, it is not possible to use the n-p substrate junction as a protection diode for a PFET. Further, in bulk technology, removal of the wafer bulk for backside wiring eliminates diodes (of any type) for protection during backside wiring processing. For at least these reasons, a p-n junction is not sufficient as a protection diode for stacked FET devices having a pFET on top and an nFET on the bottom.

Alternatively, a shunt FET may be useful as a protection diode. Similar to silicon on insulator (SOI) technology, a P shunt or N shunt-like device may be useful as the protection diode. Turned off during normal operation, the P shunt and N shunt-like devices may direct the charging current harmlessly through an isolated dummy pFET and nFET, respectively. However, even with the shunts, the source/drain (S/D) is still connected to the nanowire substrate in PFET top, NFET bottom design and manufacturing process. As such, to avoid plasma-induced damage, charge is bled off to the substrate during the top-side wire processing, making the shunts alone inadequate as protection diodes in stacked FET devices.

Accordingly, some embodiments of the present disclosure provide protection diodes for stacked FETs and BSPDNs. Such embodiments include a combined junction and shunt FET matrix, and a connection and measurement methodology to meet both antenna and characterization requirements for protection. In this way, such embodiments can improve the operation of semiconductor devices having stacked FETs with p-type FETs on top and n-type FETs on the bottom. Additionally, such embodiments can provide protection from electrostatic discharge to the BSPDN. Further, semiconductor devices with an n-type substrate and n-type FETs on top and p-type FETs on the bottom may be protected in an analogous fashion. However, it is noted that some embodiments may not have these potential advantages. Further, these potential advantages are not necessarily required of all embodiments of the present disclosure.

FIG. 1 is an example wiring schematic 100 of an example protection diode 102 and stacked FET 104, in accordance with some embodiments of the present disclosure. In this example, the protection is provided by a pFET shunt 102P and an nFET junction 108. More specifically, the protection diode 102 includes the pFET shunt 102P and the nFET junction 108. The nFET junction 108 includes an nFET with two connections to the substrate (indicated by X). The stacked FET 104 is connected to a ground (G(gnd)), and includes a top pFET 104P and a bottom nFET. The top pFET 104P is the device under test. In contrast, the bottom nFET is not tested, and not connected to the protection diode 102. Further, the wiring schematic includes a source (and drain) (S(vdd)); and, a drain (and ground) (D(gnd)). In this example, the charge entering the stacked FET 104 from the top (e.g., top pFET 104P) is directed through the pFET 102P of the protection diode 102, and then to the substrate indicated by the left-side X in the nFET junction 108. In this example, the pFET shunt 102P is always off. According to some embodiments of the present disclosure, the protection diode 102 provides protection for antenna charging to gate and antenna charging to source and drain (as allowed by connectivity). Further, during manufacture of the stacked FET 104, the protection diode 102 may protect both possible positive and negative charging. Additionally, during characterization, the substrate (X) is grounded, which keeps the gate of the stacked FET 104 and the substrate (X) at the same potential.

Additionally, FIG. 1 includes a wiring schematic 106 of a pFET shunt that provides protection to the pFET of the stacked FET 104. As shown, the pFET 104P of the stacked FET 104 is connected to the pFET 102P of the protection diode 102.

Further, FIG. 1 includes a top view 110 of the protection diode 102 and stacked FET 104. In such embodiments, the example protection diodes 102 can provide protection from PID for the nFET and pFET in the stacked FET 104 having a pFET on top, and an nFET on the bottom. As shown, a series of stacked FETs can be implemented using the protection diode 102.

Figure 2:
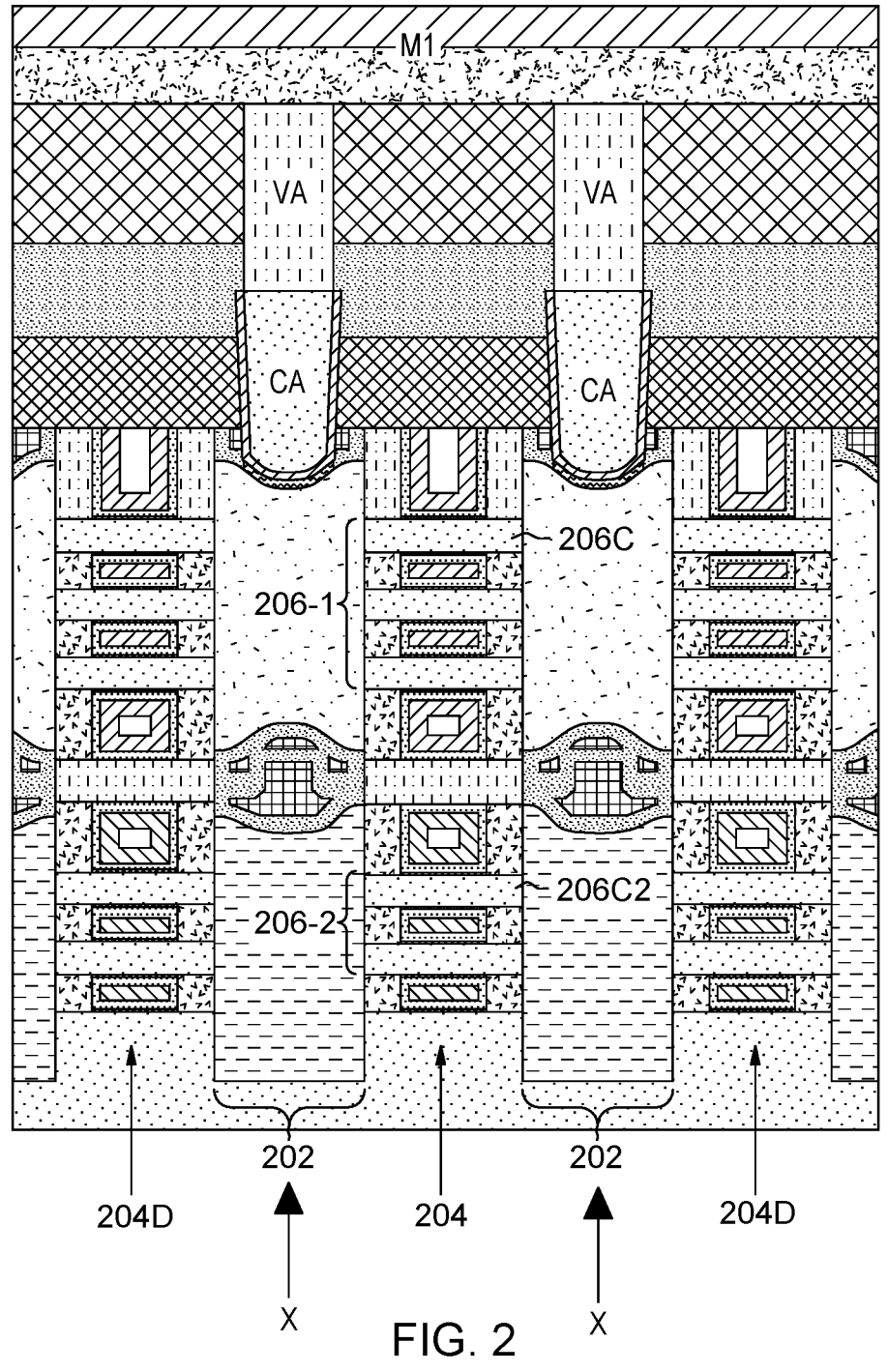
FIG. 2 is a cross-sectional view of an example protection diode, in accordance with some embodiments of the present disclosure.

FIG. 2 is a cross-sectional view of an example semiconductor structure 200 having protection diodes 202, in accordance with some embodiments of the present disclosure. The example semiconductor structure 200 includes metal line M1, vias (VA), S/D contacts (CA), protection diodes 202, stacked FET 204, dummy FETs 204D, channel regions 206-1, 206-2, and channels 206C. The protection diodes 202 and stacked FET 204 may be similar to the protection diode 102 and stacked FET 104 described with respect to FIG. 1. The channel region 206-1 is a nanosheet layer having channels 206C1 of a specific type, e.g., an n-type or p-type. More specifically, the channels 206C1 may be heavily doped epitaxial region of the specific type. Similarly, the channel region 206-2 is a nanosheet layer having channels 206C2 of a different type than the channels 206C1. Thus, if the channels 206C1 are a p-type, the channels 206C2 are an n-type. Conversely, if the channels 206C1 are an n-type, the channels 206C2 are a p-type.

Figure 3:
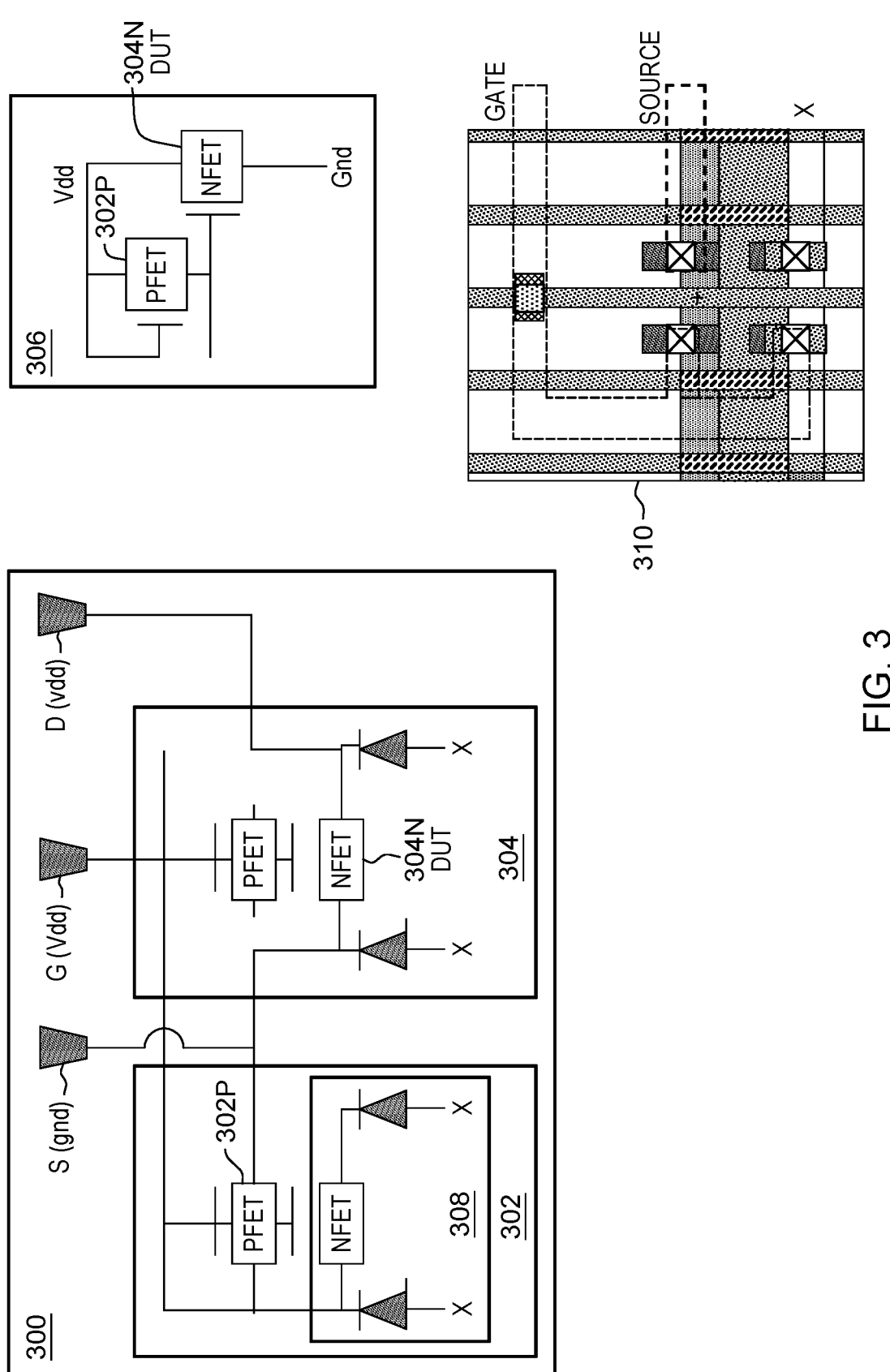
FIG. 3 is a schematic of an example protection diode and stacked FET, in accordance with some embodiments of the present disclosure.

FIG. 3 is an example wiring schematic 300 of an example protection diode 302 and stacked FET 304, in accordance with some embodiments of the present disclosure. In this example, the protection is provided by a pFET shunt 302P and an nFET junction 308. More specifically, the protection diode 302 includes the pFET shunt 302P and nFET junction 308. The nFET junction 308 includes an nFET with two connections to the substrate (indicated by X). The stacked FET 304 is connected to a ground (and drain) (G(vdd)), and includes a bottom nFET 304N and a top pFET. The bottom nFET 304N is the device under test. In contrast, the top pFET is not tested, and not connected to the protection diode 302. Further, the wiring schematic includes a source (and drain) (S(vdd)); and, a drain (and ground) (D(gnd)). In this example, the charge entering the stacked FET 304 from the bottom (e.g., bottom nFET 304N) is directed through the pFET 302P of the protection diode 302, and then to the substrate indicated by the left-side X in the nFET junction 308. In this example, the pFET shunt 302P is always off. According to some embodiments of the present disclosure, the protection diode 302 provides protection for antenna charging to gate and antenna charging to source and drain (as allowed by connectivity). Further, during manufacture of the stacked FET 304, the protection diode 302 may protect both possible positive and negative charging. Additionally, during characterization, the substrate (X) is grounded, and the nFET junction 308 has a negative bias.

Additionally, FIG. 3 includes a wiring schematic 306 of a pFET shunt 302P that provides protection to the nFET 304N of the stacked FET 304. As shown, the nFET 304N of the stacked FET 304 is connected to the pFET 302P of the protection diode 302.

Further, FIG. 3 includes a top view 310 of the protection diode 302 and stacked FET 304. In such embodiments, the example protection diodes 302 can provide protection from PID for the nFET and pFET in the stacked FET 304 having a pFET on top, and an nFET on the bottom. As shown, a series of stacked FETs can be implemented using the protection diode 302.

Figure 4:
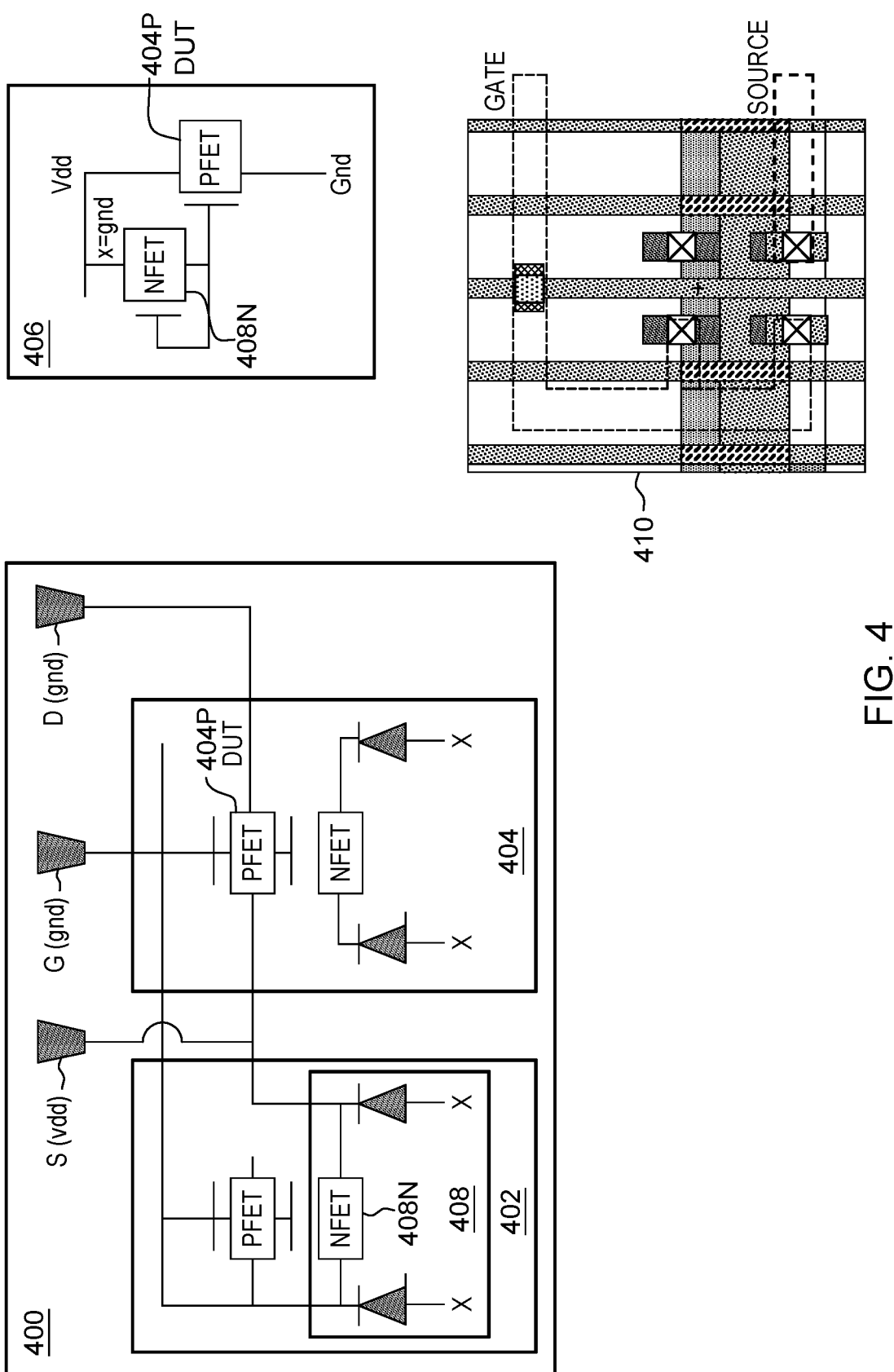
FIG. 4 is a schematic of an example protection diode and stacked FET, in accordance with some embodiments of the present disclosure.

FIG. 4 is an example wiring schematic 400 of an example protection diode 402 and stacked FET 404, in accordance with some embodiments of the present disclosure. In this example, the protection is provided by a shunt-like nFET 408N. More specifically, the protection diode 402 includes a pFET and the nFET junction 408. The nFET junction 408 includes a shunt-like nFET 408N with two connections to the substrate (indicated by X). The stacked FET 404 is connected to a ground (G(gnd)), and includes a top pFET 404P and a bottom nFET. The top pFET 404P is the device under test. In contrast, the bottom nFET is not tested, and not connected to the protection diode 402. Further, the wiring schematic includes a source (and drain) (S(vdd)); and, a drain (and ground) (D(gnd)). In this example, the charge entering the stacked FET 404 from the top (e.g., top pFET 404P) is directed through the shunt-like nFET 408N of the protection diode 402, and then to the substrate indicated by the left-side X in the nFET junction 408. In this example, the shunt-like nFET 408N is always off. Further, the shunt-like nFET 408N functions as a shunt FET in the BSPDN. According to some embodiments of the present disclosure, the protection diode 402 provides protection for antenna charging to gate and antenna charging to source and drain (as allowed by connectivity). Further, during manufacture of the stacked FET 404, the protection diode 402 may protect both possible positive and negative charging. Additionally, during characterization, the substrate (X) is grounded, which keeps the gate of the stacked FET 404 and the substrate (X) at the same potential.

Additionally, FIG. 4 includes a wiring schematic 406 of a shunt-like nFET 408N that provides protection to the pFET 404P of the stacked FET 404. As shown, the pFET 404P of the stacked FET 404 is connected to the shunt-like nFET 408N of the protection diode 402.

Further, FIG. 4 includes a top view 410 of the protection diode 402 and stacked FET 404. In such embodiments, the example protection diodes 402 can provide protection from PID for the nFET and pFET in the stacked FET 404 having a pFET on top, and an nFET on the bottom. As shown, a series of stacked FETs can be implemented using the protection diode 402.

Figure 5:
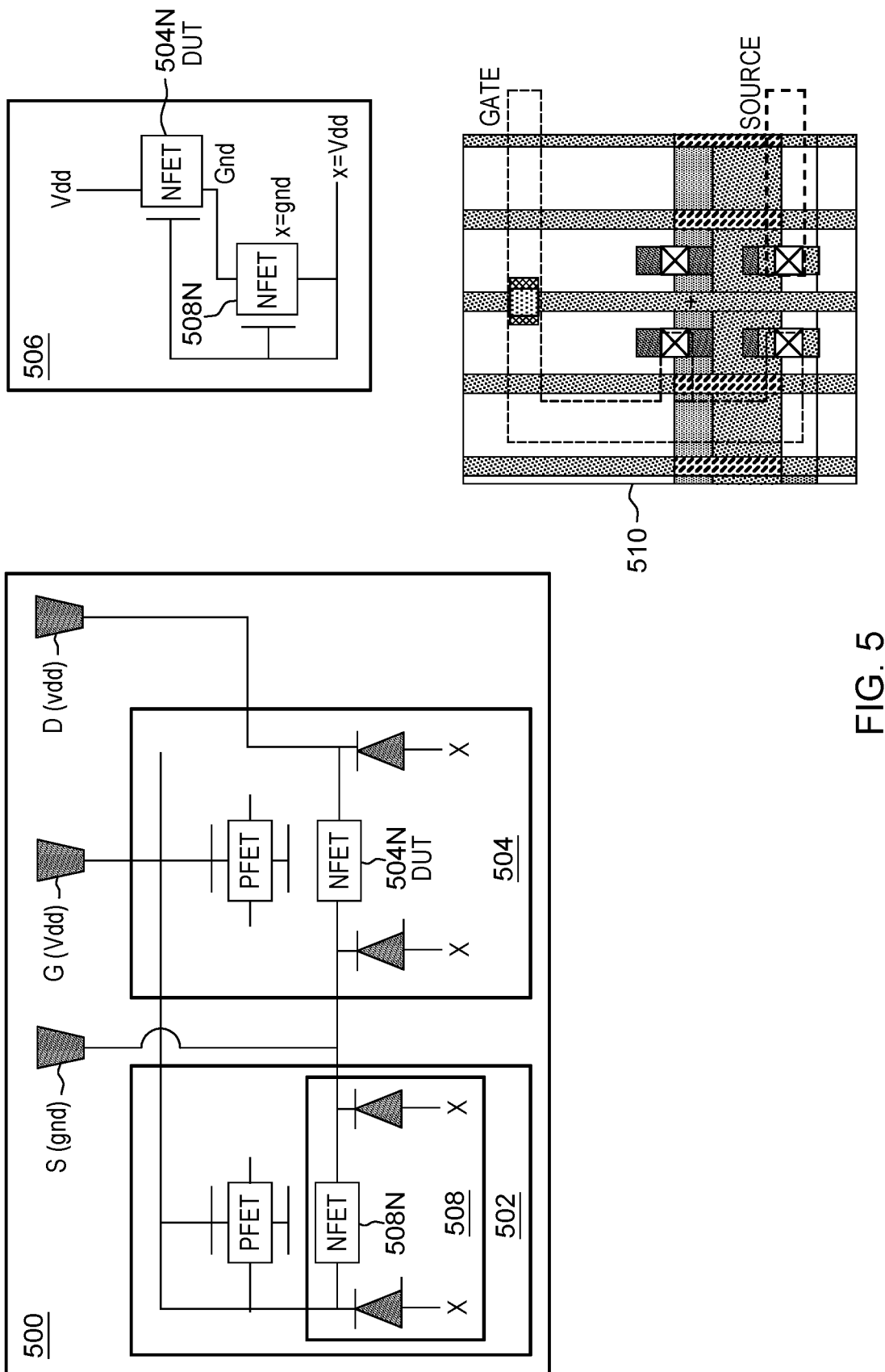
FIG. 5 is a schematic of an example protection diode and stacked FET, in accordance with some embodiments of the present disclosure.

FIG. 5 is an example wiring schematic 500 of an example protection diode 502 and stacked FET 504, in accordance with some embodiments of the present disclosure. In this example, the protection is provided by a shunt-like nFET 508N. More specifically, the protection diode 502 includes a pFET and the nFET junction 508. The nFET junction 508 includes a shunt-like nFET 508N with two connections to the substrate (indicated by X). The stacked FET 504 is connected to a ground (G(gnd)), and includes a top pFET and a bottom nFET 504N. The bottom nFET 504N is the device under test. In contrast, the top pFET is not tested, and not connected to the protection diode 502. Further, the wiring schematic includes a source (and drain) (S(vdd)); and, a drain (and ground) (D(gnd)). In this example, the charge entering the stacked FET 504 from the bottom (e.g., bottom nFET 504N) is directed through the shunt-like nFET 508N of the protection diode 502, and then to the substrate indicated by the left-side X in the nFET junction 508. In this example, the shunt-like nFET 508N is always off. Further, the shunt-like nFET 508N functions as a shunt FET in the BSPDN. According to some embodiments of the present disclosure, the protection diode 502 provides protection for antenna charging to gate and antenna charging to source and drain (as allowed by connectivity). Further, during manufacture of the stacked FET 504, the protection diode 502 may protect both possible positive and negative charging. Additionally, during characterization, the substrate (X) is grounded, which keeps the gate of the stacked FET 504 and the substrate (X) at the same potential.

Additionally, FIG. 5 includes a wiring schematic 506 of a shunt-like nFET 508N that provides protection to the nFET 504N of the stacked FET 504. As shown, the nFET 504N of the stacked FET 504 is connected to the shunt-like nFET 508N of the protection diode 502.

Further, FIG. 5 includes a top view 510 of the protection diode 502 and stacked FET 504. In such embodiments, the example protection diodes 502 can provide protection from PID for the stacked FET 504 having a pFET on top, and an nFET on the bottom. As shown, a series of stacked FETs can be implemented using the protection diode 502.

Although these examples show protection diodes for stacked FETs 104, 304, 404, 504 having a top pFET and bottom nFET, some embodiments of the present disclosure may provide protection diodes for stacked FETs having a top nFET and a bottom pFET. In such embodiments, the arrangement of the FETs in the protection diodes include a top nFET and a bottom pFET junction. Accordingly, the protecting shunt FET can be either a nFET or a pFET, so long as the source and the gate of the protecting shunt FET are connected together, which places the device in an off state. For example, in Further, according to some embodiments of the present disclosure, plasma damage can result from a high positive or high negative charge emanating from a back end of line (BEOL) process. However, the example protection diodes 102, 302, 402, 502 can allow the current to release from the pFET shunts and shunt-like nFETs of the example protection diodes 102, 302, 402, 502. In this way, the plasma damage may be released at the example protection diodes, without impacting the stacked FETs 104, 304, 404, 504 in the event of a high positive charge. Additionally, in the event of a high negative charge, the example protection diodes 102, 302, 402, 502 can allow the current to release from the pFET shunts and shunt-like nFETs at reverse BD. In this way the example protection diodes 102, 302, 402, 502 can protect the gate oxide of the stacked FETs 104, 304, 404, 504.

Figure 6:
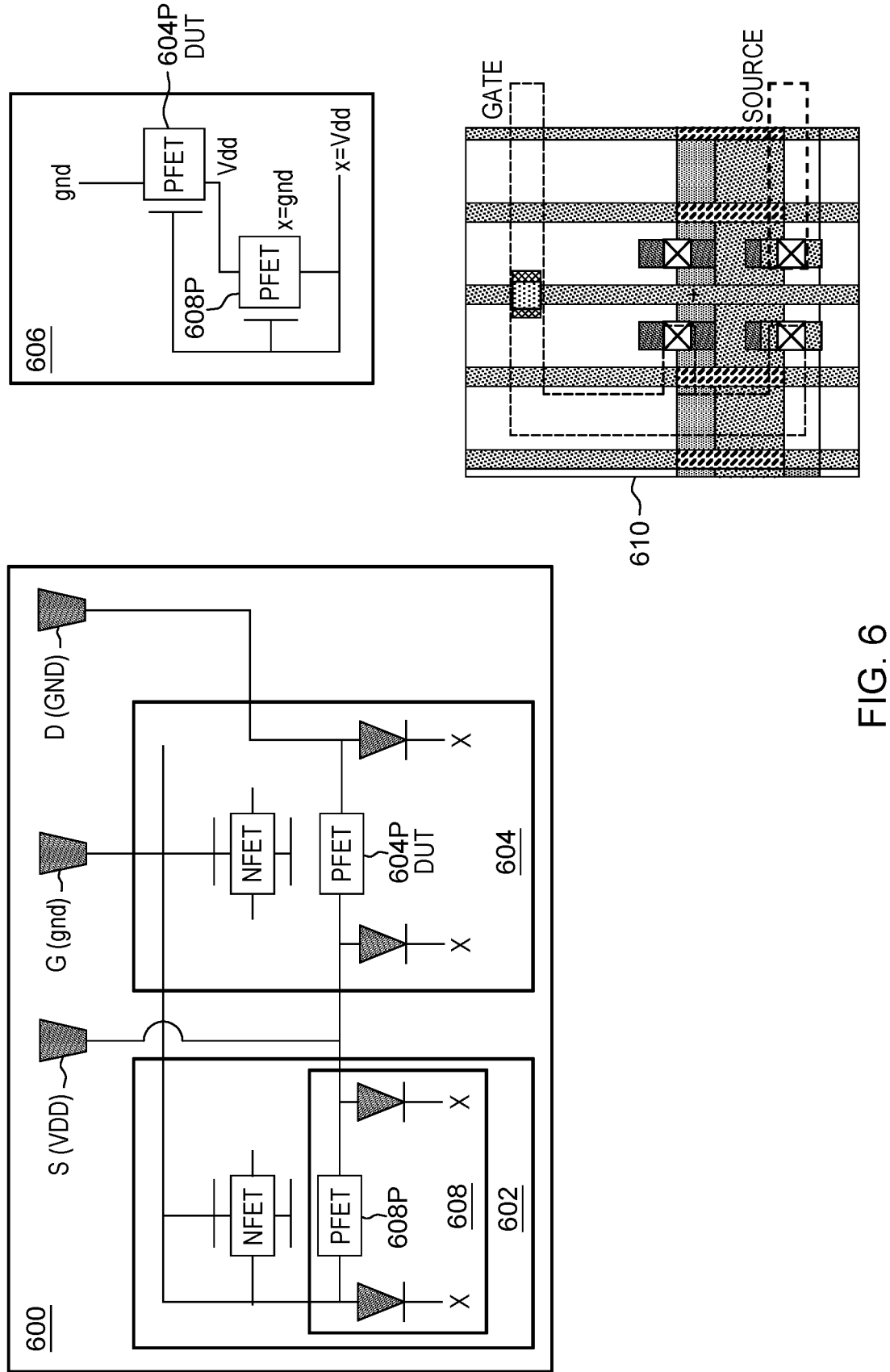
FIG. 6 is an example wiring schematic of an example protection diode and stacked FET, in accordance with some embodiments of the present disclosure.

FIG. 6 is an example wiring schematic 600 of an example protection diode 602 and stacked FET 604, in accordance with some embodiments of the present disclosure. More specifically, the protection diode 602 includes an nFET and the pFET junction 608. The pFET junction 608 includes a pFET shunt 608P with two connections to the substrate (indicated by X). In this example, the protection is provided by the pFET shunt 608P. The stacked FET 604 is connected to a ground (G(gnd)), and includes a top nFET and a bottom pFET 604P. The bottom pFET 604P is the device under test. In contrast, the top nFET of the stacked FET 604 is not tested, and not connected to the protection diode 602. Further, the wiring schematic includes a source (and drain) (S(vdd)); a ground (G(gnd)); and, a drain (and ground) (D(gnd)). In this example, the charge entering the stacked FET 604 from the bottom (e.g., bottom pFET 604P) is directed through the pFET shunt 608P of the protection diode 602, and then to the substrate indicated by the left-side X in the pFET junction 608. In this example, the pFET shunt 608P is always off. Further, the pFET shunt 608P functions as a shunt FET in the BSPDN. According to some embodiments of the present disclosure, the protection diode 602 provides protection for antenna charging to gate and antenna charging to source and drain (as allowed by connectivity). Further, during manufacture of the stacked FET 604, the protection diode 602 may protect both possible positive and negative charging. Additionally, during characterization, the substrate (X) is grounded, which keeps the gate of the stacked FET 604 and the substrate (X) at the same potential.

Additionally, FIG. 6 includes a wiring schematic 606 of the pFET shunt 608P that provides protection to the pFET 604P of the stacked FET 604. As shown, the pFET 604P of the stacked FET 604 is connected to the pFET shunt 608P of the protection diode 602.

Further, FIG. 6 includes a top view 610 of the protection diode 602 and stacked FET 604. In such embodiments, the example protection diodes 602 can provide protection from PID for the stacked FET 604 having an nFET on top, and a pFET on the bottom. As shown, a series of stacked FETs can be implemented using the protection diode 602.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks. When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category. For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations. Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to one skilled in the art. Therefore, it is intended that the following claims be interpreted as covering all such alterations and modifications as fall within the true spirit and scope of the invention.

What is claimed is:

1. A semiconductor structure comprising:
a first nanosheet layer, comprising a first channel region, and a heavily doped epitaxial region of a first type;
a second nanosheet layer comprising:
a second channel region;
a heavily doped epitaxial region of a second type disposed above the first nanosheet layer; and
a first gate surrounding the first channel region and the second channel region; and
a protection diode comprising a source, a drain, and a second gate, wherein the drain is connected to the first gate, and wherein the second gate is connected to the source.

2. The semiconductor structure of claim 1, wherein the protection diode provides protection against plasma induced damage during a manufacturing process.

3. The semiconductor structure of claim 2, wherein the manufacturing process comprises a process prior to removing a substrate of the semiconductor structure.

4. The semiconductor structure of claim 3, wherein the manufacturing process comprises a process after removing the substrate of the semiconductor structure.

5. The semiconductor structure of claim 1, further comprising a substrate, wherein the substrate is grounded.

6. The semiconductor structure of claim 5, wherein the substrate comprises a p-type substrate.

7. The semiconductor structure of claim 5, wherein the substrate comprises an n-type substrate.

8. The semiconductor structure of claim 1, wherein the first type is an n-type field effect transistor (FET), and wherein the second type is a p-type FET.

9. The semiconductor structure of claim 1, wherein the first type is an n-type FET, and wherein the second type is a p-type FET.

* * * * *